(12) United States Patent
Nakashima et al.

(10) Patent No.: US 7,832,432 B2
(45) Date of Patent: Nov. 16, 2010

(54) CHEMICAL DELIVERY APPARATUS FOR CVD OR ALD

(75) Inventors: Norman Nakashima, Sunnyvale, CA (US); Christophe Marcadal, Santa Clara, CA (US); Seshadri Ganguli, Sunnyvale, CA (US); Paul Ma, Sunnyvale, CA (US); Schubert S. Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/500,319

(22) Filed: Jul. 9, 2009

(65) Prior Publication Data
US 2010/0006167 A1  Jan. 14, 2010

Related U.S. Application Data

(63) Continuation of application No. 11/925,670, filed on Oct. 26, 2007, now Pat. No. 7,568,495, which is a continuation of application No. 11/394,448, filed on Mar. 30, 2006, now Pat. No. 7,562,672.

(51) Int. Cl.
*F16K 3/36* (2006.01)
*F16K 11/20* (2006.01)

(52) U.S. Cl. .................. 137/861; 137/209; 137/240

(58) Field of Classification Search ............ 137/209, 137/240, 861, 597
See application file for complete search history.

(56) References Cited

U.S. PATENT DOCUMENTS

| | | | |
|---|---|---|---|
| 3,844,306 A | 10/1974 | Hill | |
| 4,762,651 A | 8/1988 | Parker et al. | |
| 5,516,588 A | 5/1996 | van den Berg et al. | |
| 5,882,416 A | 3/1999 | Van Buskirk et al. | |
| 6,138,691 A * | 10/2000 | Voloshin et al. | ......... 134/22.11 |
| 6,189,323 B1 | 2/2001 | Nakamura et al. | |
| 6,296,026 B1 * | 10/2001 | Gregg et al. | .............. 137/240 |

(Continued)

FOREIGN PATENT DOCUMENTS

WO    WO-2004106584    12/2004

OTHER PUBLICATIONS

International Search Report and Written Opinion dated Oct. 2, 2008 for International Application No. PCT/US07/64276. (APPM/10885PCT).

*Primary Examiner*—Kevin L Lee
(74) *Attorney, Agent, or Firm*—Patterson & Sheridan, LLP

(57) ABSTRACT

Embodiments described herein provide ampoule assemblies to contain, store, or dispense chemical precursors. In one embodiment, an ampoule assembly is provided which includes an ampoule containing a first material layer disposed on the outside of the ampoule and a second material layer disposed over the first material layer, wherein the first material layer is thermally more conductive than the second material layer, an inlet line in fluid communication with the ampoule and containing a first manual shut-off valve disposed therein, an outlet line in fluid communication with the ampoule and containing a second manual shut-off valve disposed therein, and a first bypass line connected between the inlet line and the outlet line. In some embodiments, the ampoule assembly may contain disconnect fittings. In other embodiments, the first bypass line has a shut-off valve disposed therein to fluidly couple or decouple the inlet line and the outlet line.

25 Claims, 12 Drawing Sheets

U.S. PATENT DOCUMENTS

| | | |
|---|---|---|
| 6,592,707 B2 | 7/2003 | Shih et al. |
| 6,630,201 B2 | 10/2003 | Chiang et al. |
| 6,699,524 B2 | 3/2004 | Kesala |
| 6,701,066 B2 | 3/2004 | Sandhu |
| 6,718,126 B2 | 4/2004 | Lei |
| 6,772,072 B2 | 8/2004 | Ganguli et al. |
| 6,889,864 B2 | 5/2005 | Lindfors et al. |
| 6,905,541 B2 | 6/2005 | Chen et al. |
| 6,915,592 B2 | 7/2005 | Guenther |
| 6,921,062 B2 | 7/2005 | Gregg et al. |
| 6,955,211 B2 | 10/2005 | Ku et al. |
| 7,066,194 B2 | 6/2006 | Ku et al. |
| 7,122,085 B2 | 10/2006 | Shero et al. |
| 7,129,194 B2 | 10/2006 | Baca et al. |
| 7,156,380 B2 | 1/2007 | Soininen |
| 7,186,385 B2 | 3/2007 | Ganguli et al. |
| 7,195,026 B2 | 3/2007 | Znamensky et al. |
| 7,198,056 B2 * | 4/2007 | Silva .......................... 137/209 |
| 7,228,873 B2 | 6/2007 | Ku et al. |
| 7,237,565 B2 | 7/2007 | Hioki et al. |
| 7,270,709 B2 | 9/2007 | Chen et al. |
| 7,294,208 B2 | 11/2007 | Guenther |
| 7,300,038 B2 | 11/2007 | Gregg et al. |
| 7,370,661 B2 | 5/2008 | Tom |
| 7,429,361 B2 | 9/2008 | Ganguli et al. |
| 7,464,917 B2 | 12/2008 | Lee et al. |
| 7,524,374 B2 | 4/2009 | Chen et al. |
| 7,556,244 B2 | 7/2009 | Gregg et al. |
| 7,562,672 B2 | 7/2009 | Nakashima et al. |
| 7,568,495 B2 | 8/2009 | Nakashima et al. |
| 7,569,191 B2 | 8/2009 | Ganguli et al. |
| 7,588,736 B2 | 9/2009 | Chen et al. |
| 7,597,758 B2 | 10/2009 | Chen et al. |
| 7,601,225 B2 | 10/2009 | Tuominen et al. |
| 2003/0121609 A1 | 7/2003 | Ohmi et al. |
| 2004/0170403 A1 | 9/2004 | Lei |
| 2005/0000428 A1 | 1/2005 | Shero et al. |
| 2005/0095859 A1 | 5/2005 | Chen et al. |
| 2007/0089817 A1 | 4/2007 | Ganguli et al. |
| 2008/0044573 A1 | 2/2008 | Chen et al. |
| 2008/0085226 A1 | 4/2008 | Fondurulia et al. |
| 2008/0099933 A1 | 5/2008 | Choi et al. |
| 2008/0149031 A1 | 6/2008 | Chu et al. |
| 2009/0314370 A1 | 12/2009 | Nakashima et al. |

* cited by examiner

CHEMICAL DELIVERY APPARATUS FOR CVD OR ALD

CROSS-REFERENCE TO RELATED APPLICATIONS

This application is a continuation of U.S. Ser. No. 11/925,670, filed Oct. 26, 2007, now issued as U.S. Pat. No. 7,568,495, which is a continuation of U.S. Ser. No. 11/394,448, filed Mar. 30, 2006, now issued as U.S. Pat. No. 7,562,672, which are herein incorporated by reference in their entirety.

BACKGROUND OF THE INVENTION

1. Field of the Invention

Embodiments of the invention relate to an apparatus and method used for the delivery of chemical precursors. More particularly, the invention relates to an ampoule configured with a valve manifold that includes a bypass line and a bypass valve.

2. Description of the Related Art

Chemical vapor deposition (CVD) and atomic layer deposition (ALD) are known techniques for forming a material on a substrate by the reaction of vapor phase chemicals near the surface of a substrate. In general, CVD and ALD techniques involve the delivery of gaseous reactants to the substrate surface where a chemical reaction takes place under temperature and pressure conditions favorable to the thermodynamics of the reaction. The type and composition of the layers that may be formed using a CVD process or an ALD process are limited by the ability to deliver a chemical reactant or precursor to the substrate surface. Various liquid precursors have been successfully used during CVD and ALD applications by delivering the liquid precursors within a carrier gas.

A carrier gas is in some cases passed through a heated container, or ampoule, which contains a volatile liquid precursor under conditions conducive to vaporize the precursor. In other cases, a carrier gas is passed through a heated container containing a solid precursor under conditions conducive to sublimation of the solid precursor. Some gases that may be produced through a sublimation process include xenon difluoride, nickel carbonyl, tungsten hexacarbonyl, and pentakis dimethylamido tantalum (PDMAT) among others. In either case, the carrier gas combines with the vaporized precursor and both are drawn from the container via dedicated conduits or gas lines to a reaction chamber. Because the chemical precursors for CVD and ALD applications are typically highly toxic and because the heated container and chemical delivery components proximate thereto are generally at an elevated temperature, precursor-containing ampoules are typically located inside a protective housing, such as a gas cabinet or gas panel.

A typical gas panel for CVD or ALD applications contains various valves, regulators, and flow controllers in addition to one or more precursor-containing ampoules. For safety reasons, gas panels are also generally equipped with exhaust ventilation and are locked and alarmed to prevent possible exposure of personnel to the toxic precursors and heated components located therein. Because the removal and installation of precursor-containing ampoules requires entry into a gas cabinet by maintenance personnel, it is important to minimize the possibility of leakage from depleted ampoules when they are being removed and from fully charged ampoules when they are being installed.

A typical ampoule replacement procedure includes a number of steps including isolation, initial pump-purge, removal/replacement, leak check, final pump-purge, and connection.

In the isolation step, the spent precursor ampoule is fluidly isolated from the processing system, typically via manual shut-off valves located on the inlet and outlet plumbing of the ampoule. This typically requires entry into the gas cabinet by maintenance personnel despite proximity to gas panel components at elevated temperatures and the presence of unpurged gas lines containing highly toxic chemicals.

An initial pump-purge is then performed on any gas lines or valves that have been exposed to toxic agents and which will also be exposed to atmosphere during the ampoule changeout. The pump-purge may include pumping down the appropriate conduits, valves, and other fittings one or more times with a rough, medium, or high vacuum source, depending on the particular precursor used. Between pump-downs, the lines and valves may be purged with a gas, such as an inert gas. In some cases a liquid purge of conduits and valves may be performed to more efficiently remove unwanted and toxic residues present therein, particularly solid residues or residues with a very low vapor pressure. The removal of unwanted chemical residues from a conduit or valve via pump/purging is more effective when the gas or liquid used for purging can be actively passed through the conduit or valve. This is not possible wherever a "dead leg" is present, i.e., a section of pipe or conduit that does not form part of a constant circulation system. Instead, unwanted residues are removed from a dead leg by alternately pumping the dead leg down to vacuum and back-filling it with purge fluid, which is known in the art to be less effective than the active passage of purge fluid through a conduit or fitting. This is especially true for dead legs that are relatively long and/or contain elbows or other non-linear fittings.

After the pump-purge step has been completed with the requisite number of pump-purge cycles on the desired conduits, the removal/replacement of the ampoule may be performed. In this step, the ampoule is removed from the gas cabinet and a fully charged replacement is installed. The ampoule is typically separated from the gas cabinet by means of quick disconnect type fittings or re-sealable vacuum-tight fittings, such as VCR fittings. In some cases, the fluid delivery system that is exposed to atmosphere as a result of the ampoule replacement is slightly pressurized during the removal/replacement step with an inert gas. This slight pressurization minimizes entry into the fluid delivery system of unwanted contaminants, such as oxygen and/or moisture. The replacement ampoule is then connected to the fluid delivery system via the appropriate fittings in the gas cabinet.

Because CVD and ALD precursors are typically highly reactive and in some cases corrosive, it is known in the art that ampoule shut-off valves may not always be completely leak-tight, particularly after removal of a depleted ampoule from a gas cabinet. This is due to the prolonged exposure of the shut-off valves' sealing surfaces to the precursor chemical flowing therethrough during the lifetime of the ampoule. Any leakage of the ampoule shut-off valve is a serious issue for two reasons: the potential for contaminants to enter the ampoule and, more importantly, the potential for a dangerous precursor chemical to leak out of the ampoule and expose personnel to toxic chemicals.

After the replacement ampoule is installed, a helium leak check is typically performed on any fluid delivery connection points or other seals that were broken during ampoule removal/replacement. This generally involves pumping down the connection points to be tested to a relatively high level of vacuum.

When all connections have passed leak checking, a final pump-purge of the fluid delivery system associated with the ampoule replacement is performed. The final pump-purge is intended to maintain the ultra-high purity of chemicals delivered to a processing chamber after exposure of the fluid delivery system to airborne contaminants, such as moisture and oxygen. As described above for the initial pump-purge, the final pump-purge step generally includes alternately pumping down and fluidly purging conduits and other fittings that may have been exposed to atmospheric contaminants. While a final pump-purge step ensures a cleaner fluid delivery system for subsequent CVD or ALD processing, it may also precipitate leakage into or out of the newly charged ampoule due to the additional stresses placed on the ampoule shut-off valve resulting from alternately pressurizing and evacuating a conduit fluidly coupled thereto.

Finally, after the above steps have been completed, the new ampoule is fluidly connected to the fluid delivery system that terminates in the gas cabinet by opening the manual shut-off valves located on the inlet and outlet plumbing of the ampoule. As with the isolation step, this typically requires entry into the gas cabinet by maintenance personnel.

FIG. 1 is a simplified schematic of a conventional process gas delivery system. Fluid delivery system 202 is suitable for producing a process gas containing a chemical precursor and generally includes process chamber 206 and a carrier gas source 205 coupled to gas panel 204, the components of the latter being controlled by a controller 250. Gas panel 204 generally controls the rate and pressure at which various process and carrier gases are delivered to process chamber 206. Process chamber 206 may be a chamber to conduct vapor deposition processes or thermal processes containing a vaporized chemical precursor in liquid, gaseous or plasma state. Process chamber 206 is generally a chemical vapor deposition (CVD) chamber, an atomic layer deposition (ALD) chamber, or a derivative thereof. Examples of process chamber 206 include PRODUCER® CVD chambers and DZX® CVD chambers available from Applied Materials, Inc., located in Santa Clara, Calif., or an ALD chamber, such as that described in commonly assigned U.S. Pat. No. 6,916,398.

In the configuration illustrated in FIG. 1, controller 250 includes central processing unit (CPU) 252, memory 254 and support circuits 256. Central processing unit 252 may be one of any form of computer processor that can be used in an industrial setting for controlling various chambers and sub-processors. Memory 254 is coupled to CPU 252 and may be one or more of readily available memory such as random access memory (RAM), read only memory (ROM), flash memory, compact disc, floppy disk, hard disk or any other form of local or remote digital storage. Support circuits 256 are coupled to CPU 252 for supporting CPU 252 in a conventional manner. These circuits include cache, power supplies, clock circuits, input/output circuitry, subsystems, and the like.

Fluid delivery circuit 236 is generally intended to fluidly couple carrier gas source 205, ampoule 200, and process chamber 206 as necessary for operation of process chamber 206. Carrier gas source 205 may be a local vessel, remote vessel or a centralized facility source that supplies the carrier gas throughout the facility (e.g., in-house gas supply). Carrier gas source 205 typically supplies a carrier gas such as nitrogen, hydrogen, argon, helium or combinations thereof. Additional purge fluid sources (not shown) may also be fluidly coupled to fluid delivery circuit 236 when the use of specialized purge fluids, such as a purge liquid, is required. Fluid delivery circuit 236 typically includes a flow controller 220 disposed between carrier gas source 205 and junction 230 and is adapted to modulate the flow rate of carrier gas or other fluids through fluid delivery circuit 236. Flow controller 220 may be a proportional valve, a modulating valve, a needle valve, a regulator, a mass flow controller (MFC) or the like. Junction 230 separates fluid delivery circuit 236 into gas generation line 238 and bypass line 240. Junction 232 rejoins gas generation line 238 and bypass line 240 before connecting to process chamber 206.

Gas generation line 238 includes ampoule inlet leg 238a, ampoule outlet leg 238b, valves 208, 210, 212, sensors 226, 228, disconnect fittings 262 and 263, and heater 222. Ampoule inlet leg 238a fluidly couples the inlet of ampoule 200 to carrier gas source 205 and to bypass line 240. Ampoule outlet leg 238b fluidly couples the outlet of ampoule assembly 200 to process chamber 206 and to bypass line 240. Valves 208, 210 and 212 are typically remotely controllable shut-off valves that serve to divert the flow of fluids within fluid delivery circuit 236 and/or are used to selectively isolate the various components within fluid delivery circuit 236 to facilitate removal, replacement and/or service of an isolated component, including sensors 226, 228, heater 222, and ampoule assembly 200. Valves 208, 210, 212, as well as valves 214, 216, 218 (described below in conjunction with bypass line 240) are generally pneumatically or electronically controlled and the internal wetted surfaces thereof are fabricated from materials compatible with the process and other fluids handled by fluid delivery circuit 236. Typically, valves 208, 210, 212, 214, 216, and 218 are actuated in response to a signal from a controller 250 to coordinate the delivery of gases through fluid delivery circuit 236. Sensors 226, 228 are generally adapted to detect the temperature of a process, carrier, and/or purge fluid flowing through gas generation line 238, such as a thermocouple disposed against a conduit of gas generation line 238.

Bypass line 240 generally includes valves 214, 216 and heater 224 and serves to fluidly couple process chamber 206 and carrier gas source 205 without the use of gas generation line 238 or ampoule assembly 200. Valve 218 is generally coupled between junction 232 and process chamber 206 and may be used to isolate process chamber 206 from fluid delivery circuit 236. Heaters 222, 224 are resistive heating elements or other heat sources adapted to heat a flow of fluid, such as a carrier gas, flowing through gas generation line 238 and bypass line 240, respectively.

Ampoule assembly 200 generally contains an ampoule, or body 270, an inlet line 264, an outlet line 265, disconnect fittings 262b, 263b, and manual shut-off valves, manual valves 260 and 261, disposed in inlet line 264, 265, respectively. Dead leg conduit segment 271b is disposed in inlet line 264 between manual valve 260 and disconnect fitting 262 and dead leg conduit segment 272b is disposed in outlet line 265 between manual valve 261 and disconnect fitting 263. Ampoule assembly 200 may also be referred to as a bubbler, a canister, and other terms known in the art to describe containers designed and used to store, transport and distribute chemical precursors. Inlet line 264 is coupled to ampoule inlet leg 238a at disconnect fitting 262 and outlet line 265 is coupled to ampoule outlet leg 238b at disconnect fitting 263. Disconnect fitting 262 and 263 are typically adapted to facilitate removal and replacement of ampoule assembly 200 in gas panel 204 while leaving all other components of gas panel 204 in place, such as gas generation line 238 and its constituent parts. To this end, disconnect fittings 262 and 263 typically include mating disconnect fittings 262a, 262b and 263a, 263b respectively, wherein disconnect fittings 262b, 263b are inherent to ampoule assembly 200 and corresponding disconnect fittings 262a, 263a are contained in fluid delivery circuit 236. Depending on the application, disconnect fittings 262a, 262b and 263a, 263b may be quick disconnect type fittings, re-sealable vacuum-tight fittings, such as VCR fittings, or other suitable disconnect fittings.

Ampoule assembly 200 may have a variety of sizes and geometries. Ampoule assembly 200 may have a volume capacitance of a chemical precursor within a range from about 0.5 L to about 10 L and more typically from about 1.2 L to about 4 L. In one example, ampoule assembly 200 has a volume capacitance of a chemical precursor of about 2.5 L. Chemical precursors that may be within ampoule assembly 200 include liquid, solid and gaseous precursors, preferably in liquid or fluid-like states at predetermined temperatures and/or pressures. For example, a chemical precursor may exist in the solid state at room temperature, but melts to the liquid state upon being heated to a predetermined temperature within the ampoule. In another example, the majority of a chemical precursor may remain in the solid state in the ampoule, but is heated to an elevated temperature during processing such that a small amount of the solid precursor sublimates directly into vapor. In another example, a chemical precursor may exist in the gaseous state at ambient pressure, but condenses to the liquid state upon being pressurized to a predetermined pressure within the ampoule. Chemical precursors may include alane complexes, such as 1-methylpyrolidrazine:alane (MPA, $MeC_4H_3N:AlH_3$), pyridine:alane ($C_4H_4N:AlH_3$), alkylamine alane complexes (e.g., trimethylamine:alane ($Me_3N:AlH_3$), triethylamine:alane ($Et_3N:AlH_3$), dimethylethylamine:alane ($Me_2EtN:AlH_3$)), trimethylaluminum (TMA, $Me_3Al$), triethylaluminum (TEA, $Et_3Al$), tributylaluminum ($Bu_3Al$), dimethylaluminum chloride ($Me_2AlCl$), diethylaluminum chloride ($Et_2AlCl$), dibutylaluminum hydride ($Bu_2AlH$), dibutylaluminum chloride ($Bu_2AlCl$), water, hydrogen peroxide ($H_2O_2$), hydrazine ($N_2H_4$), titanium tetrachloride ($TiCl_4$), tetrakis(dimethylamido)titanium (TDMAT, $(Me_2N)_4Ti$)), tetrakis(diethylamido) titanium (TEMAT, $(Et_2N)_4Ti$)), bis(ethylcyclopentadienyl) ruthenium (($EtCp)_2Ru$), tetrakis(dimethylamido)hafnium (TDMAH, $(Me_2N)_4Hf$)), tetrakis(diethylamido)hafnium (TDEAH, $(Et_2N)_4Hf$)), tetrakis(methylethylamido)hafnium (TMEAH, $(MeEtN)_4Hf$)), tertiaryamylimido tris(dimethylamido)tantalum (TAIMATA, $(^tAmylN)Ta(NMe_2)_3$, wherein $^tAmyl$ is the tertiaryamyl group ($C_5H_{11}$— or $CH_3CH_2C(CH_3)_2$—), derivatives thereof, or combinations thereof.

During processing, a carrier gas flows from carrier gas source 205 through fluid delivery circuit 236 to ampoule assembly 200. The carrier gas may be heated by heater 222, ampoule assembly 200 itself may be heated to a desired temperature, or in some applications, both the carrier gas and ampoule assembly 200 may be heated. During processing, valves 214 and 216 are closed, directing all carrier gas flow to process chamber 206 via gas generation line 238 and ampoule assembly 200.

During an initial pump-purge procedure performed prior to removing and replacing ampoule assembly 200, manual valves 260 and 261 are closed. This isolates body 270 from gas generation line 238. During a pump-down segment of a pump-purge procedure, carrier gas source 205 is also isolated from fluid delivery circuit 236 by a shut-off valve (not shown) located between carrier gas source 205 and fluid delivery circuit 236. The vacuum source for process chamber 206 is typically used to pump down fluid delivery circuit 236 and dead leg conduit segments 271b and 272b of ampoule assembly 200. Alternatively, a dedicated vacuum source may be used, such as a vacuum pump fluidly coupled to fluid delivery circuit 236. In either case, all components of fluid delivery circuit 236 that are not isolated from the vacuum source are pumped down to a desired vacuum level, e.g., rough, medium, or high vacuum, by opening the requisite valves in gas panel 204. For example, when the vacuum source of process chamber 206 is used for pumping down fluid delivery circuit 236, valve 218 is opened to fluidly couple process chamber 206 to fluid delivery circuit 236, valves 214 and 216 are opened so that bypass line 240 fluidly couples ampoule inlet leg 238a to vacuum, and valves 210 and 212 are opened to fluidly couple conduit segments 271, 272 and dead leg conduit segments 271b and 272b to vacuum. The desired level of vacuum targeted during the pump-down segment depends on each particular CVD or ALD application and is a function of factors such as the vapor pressure of precursors and other residues being removed, fluid delivery line length, etc. It is important to note that it is necessary for maintenance personnel to enter gas panel 204 despite the presence of unpurged fluid delivery lines in order to close manual valves 260 and 261 of ampoule assembly 200.

For a purge segment of a pump-purge procedure, a purge fluid source, such as carrier gas source 205, is fluidly coupled to fluid delivery circuit 236 and the desired purge fluid is introduced therein. The desired purge fluid may be a gas, such as an inert gas or other carrier gas, or a liquid, including solvents such as tetrahydrofuran (THF) or triglyme. Composition of the purge fluid depends on the physical state and chemical make-up of the chemical residues to be purged, solid particles and low vapor pressure liquids sometimes requiring one or more liquid solvent purges. Further, the purge fluid may also be heated during the purge segment to aid in the removal of unwanted chemical residue, either prior to be introduced into fluid delivery circuit 236 or by heaters 222, 224. The vacuum source, such as process chamber 206 in one example, may be isolated from fluid delivery circuit 236 during the purge segment or it may be fluidly coupled thereto in order to continuously remove purge fluid throughout the purge segment. It is important to note that active flow of purge fluid occurs principally along bypass line 240 during a purge procedure. The only active flow of purge fluid into ampoule inlet leg 238a and ampoule outlet leg 238b occurs when these two sections of fluid delivery circuit are back-filled with purge fluid at the beginning of a purge segment. Hence, ampoule inlet leg 238a and ampoule outlet leg 238b act as extensive dead legs of significant length and potentially include numerous flow-restricting elbows. Further, the regions of fluid delivery circuit 236 that will be exposed to atmosphere during ampoule replacement, i.e., conduit segments 271, 272, and dead leg conduit segments 271b and 272b, are most likely to be contaminated and are the most important to purge thoroughly in preparation thereof. However, conduit segments 271, 272, and dead leg conduit segments 271b and 272b are located at the distal ends of the above-described dead legs and are, therefore, the most difficult regions of fluid delivery circuit 236 to purge effectively.

During removal, valves 210 and 212 are closed to fluidly isolate conduit segments 271, 272 from fluid delivery circuit 236, and disconnect fittings 262 and 263 are separated to allow removal of ampoule assembly 200, wherein mating disconnect fittings 262b, 263b inherent to ampoule assembly 200 and are removed therewith. As noted above, it is known in the art that ampoule shut-off valves, i.e., manual valves 260 and 261, may not always be completely leak-tight after prolonged exposure to the precursor chemicals contained in ampoule assembly 200. Because a single point of isolation is used for ampoule assembly 200 at inlet line 264 and outlet line 265, i.e., manual valves 260 and 261, respectively, there is the potential of leakage into or out of ampoule assembly 200 during the removal of a depleted ampoule from gas panel 204. A freshly-charged ampoule is reconnected to fluid delivery circuit 236 at disconnect fittings 262 and 263.

After installation of a new ampoule assembly 200, any fluid delivery connection points or other seals that were broken during ampoule removal/replacement are leak-checked, in this example disconnect fittings 262 and 263. Leak checking ensures that contaminants are not drawn into fluid delivery circuit 236 and that toxic chemical precursors do not leak out of ampoule assembly 200 during processing. If either of disconnect fittings 262 and 263 are not vacuum-tight, only a single point of isolation is present between the chemical contents of ampoule assembly 200 and any contaminants that may have leaked into dead leg conduit segments 271b and 272b.

Therefore, there is a need for an apparatus and process to purge gas lines as completely as possible, to perform pump-purge procedures with minimal entry into a gas cabinet, and to decrease the possibility of leakage into or out of precursor-containing ampoules before, during, and after removal and installation of such ampoules.

SUMMARY OF THE INVENTION

Embodiments of the present invention provide an apparatus used for the delivery of chemical precursors and a method for purging said apparatus. In one embodiment, an ampoule assembly comprises an inlet line, an outlet line, and a bypass line connected between the inlet line and the outlet line, the bypass line having a shut-off valve disposed therein to fluidly couple or decouple the inlet line and the outlet line. The ampoule assembly may further comprise manual shut-off valves disposed in the inlet and outlet lines and remotely controllable shut-off valves disposed in the inlet and the outlet lines respectively between the ampoule and the manual shut-off valves. In one aspect, the ampoule assembly comprises one or more thermally conductive coatings that improve the uniformity of temperature inside the ampoule body.

Embodiments of the present invention also provide a method for purging fluid lines of an ampoule assembly including an inlet line, an outlet line, and a bypass line connecting the inlet line and the outlet line. The method according to an embodiment includes remotely opening a valve disposed in the bypass line, remotely closing valves disposed in the inlet and outlet lines, and pump-purging the bypass line and other lines and valves fluidly coupled thereto.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures.

DETAILED DESCRIPTION

Aspects of the invention contemplate a chemical-containing ampoule or container having an inlet conduit and an outlet conduit and being configured to include a bypass conduit and a remotely controllable valve fluidly connecting the inlet and outlet conduits. Aspects also contemplate a pair of shut-off valves configured in series on both the inlet and outlet conduits of the ampoule, wherein each pair of valves includes a positive sealing manual valve, such as a ¼-turn ball valve, and a remotely controllable valve, such as a pneumatic valve. Aspects further contemplate charging or back-filling some or all components of a chemical-containing ampoule with an inert gas, such as He. In one example, the body and inlet and outlet lines of a precursor-containing ampoule assembly are charged with an inert gas above atmospheric pressure. In another example, segments of the inlet and outlet lines of a precursor-containing ampoule assembly are charged with an inert gas above atmospheric pressure. Another aspect of the invention contemplates an ampoule body that provides more uniform heating of its contents via one or more layers of a thermally conductive coating.

For reasons of chemical compatibility and mechanical strength, body 270 is typically made of 316 stainless steel (316 SST). Chemical inertness is an important requirement for body 270 since the majority of chemical precursors, such as those listed above, are highly reactive materials. Substantial mechanical strength is a requirement for body 270 since body 270 of ampoule assembly 200 may operate at vacuum during processing yet may be pressurized above atmospheric pressure for transport and storage. Hence, body 270 must act as a reliable containment vessel for a toxic chemical precursor while utilized as a vacuum chamber or as a pressure vessel.

Because 316 SST is a poor medium for thermal conductivity, undesirable thermal gradients may develop inside body 200 during processing. For example, when a liquid chemical precursor is contained inside body 200, more and more volume of body 200 is vapor-filled as the liquid precursor is depleted, poor thermal conductivity of body 200 may result in uneven heating, i.e., "hot spots," in the liquid precursor later in the life of the ampoule. In another example, such as when body 200 contains a solid chemical precursor, poor thermal conductivity of body 200 may create hot spots throughout the life of the ampoule. In either case, a CVD or ALD process may be detrimentally affected by such temperature non-uniformities.

Figure 3A:
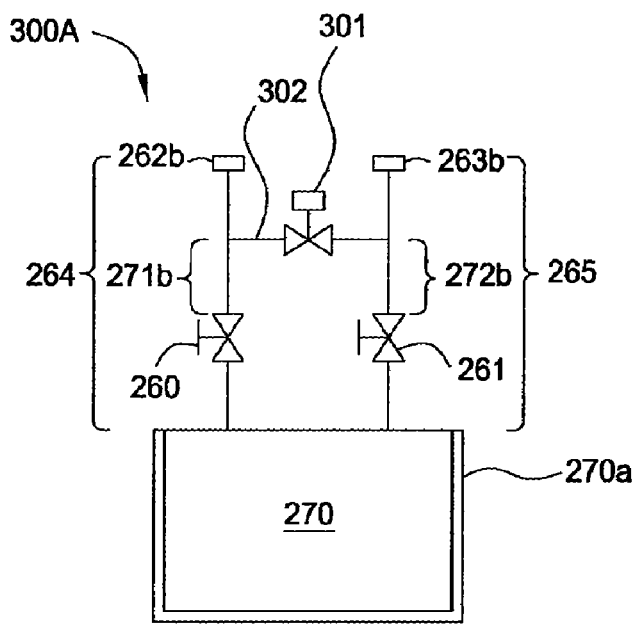
FIGS. 3A-3H are schematic diagrams of a chemical-containing container according to different embodiments of the invention.

In order to improve the temperature uniformity of a chemical precursor contained in ampoule assembly 200, aspects of the invention contemplate a configuration of body 270 wherein body 270 is enhanced with a thermally conductive layer 270a of thermally conductive material to improve heat conduction throughout body 270, as depicted in FIG. 3A. Thermally conductive layer 270a may be a simple coating or may be an interlayer sandwiched between an inner and an outer layer of a stronger but less thermally conductive material, such as 316 SST. FIG. 3G illustrates a partial sectional schematic view of body 270, wherein thermally conductive layer 270a is sandwiched between two layers 270b and 270c of one or more mechanically stronger materials. FIG. 3H illustrates a partial sectional schematic view of body 270, wherein multiple thermally conductive layers 270a are sandwiched between multiple layers 270d-270f of one or more mechanically stronger materials to form a layered structure. Thermally conductive layer 270a is illustrated as a coating of body 270 of ampoule assembly 300A in FIG. 3A, however thermally conductive layer 270a may easily be incorporated into the embodiments illustrated in FIGS. 3B-3F as well. Thermally conductive layer 270a may be applied to body 270 by electroplating or any other coating method. Examples of possible materials for 270a include aluminum, copper, silver, brass, or any other thermally conductive material that is substantially more heat conducting than the material comprising the bulk of body 270. The thickness of layer 270a may range from a few microns to several millimeters. For example, the thickness may be between about 1 micrometer and about 5 millimeters.

Figure 1:
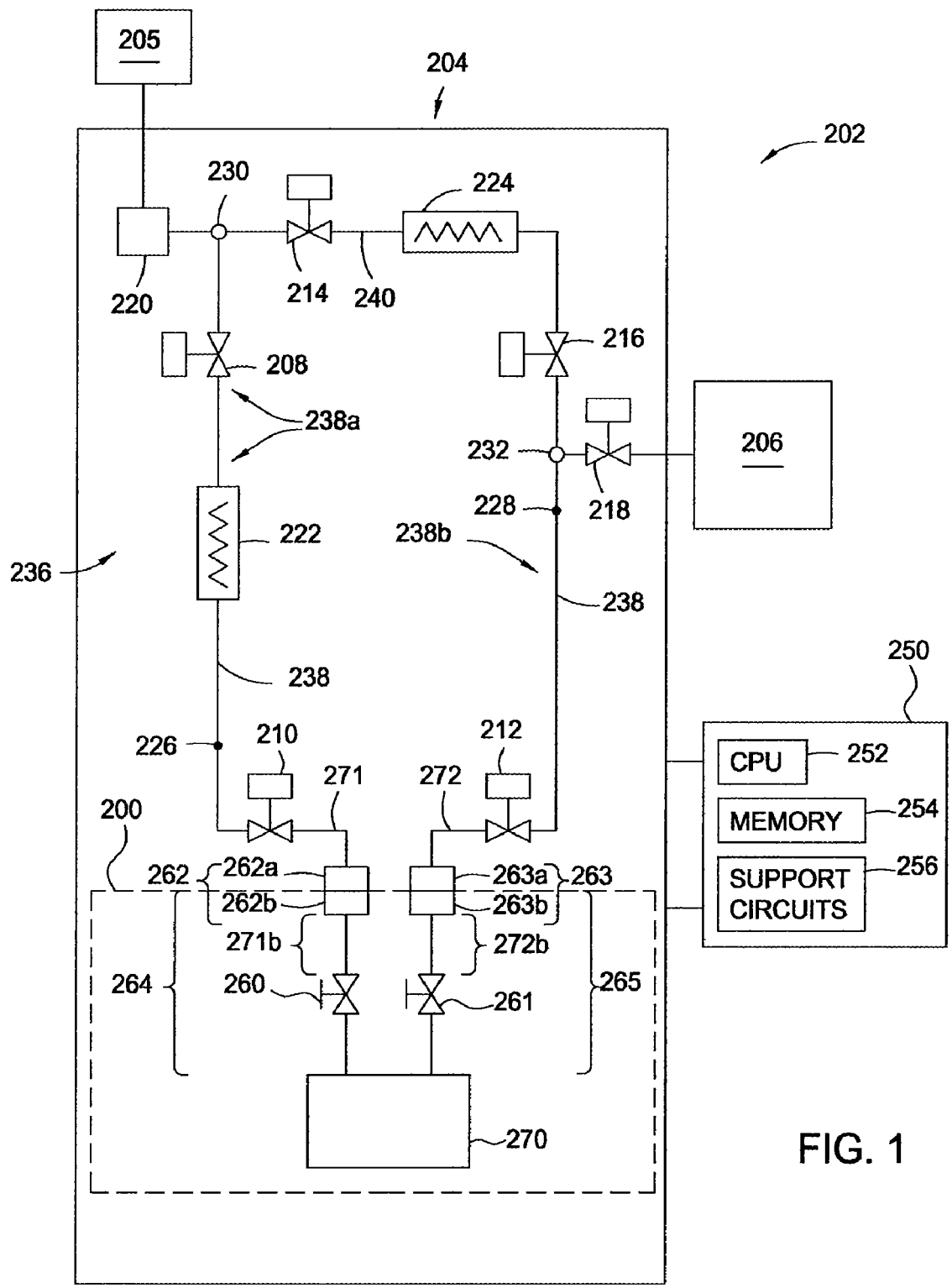
FIG. 1 (Prior Art) is a simplified schematic of a process gas delivery system that employs a conventional ampoule assembly.
Figure 2A:
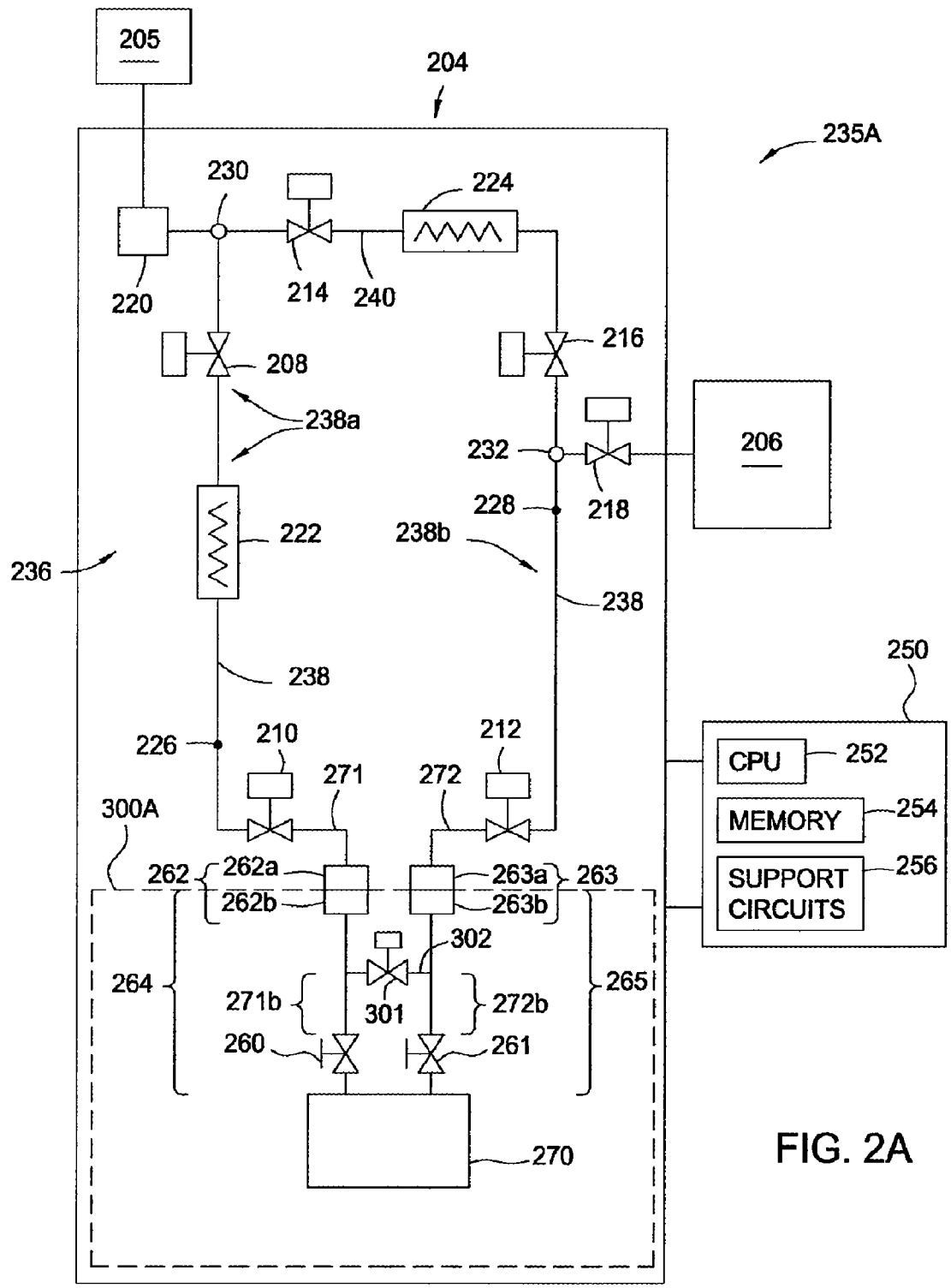
FIGS. 2A-2C are schematic diagrams of a fluid delivery system to which an ampoule assembly has been fluidly coupled.
Figure 4A:
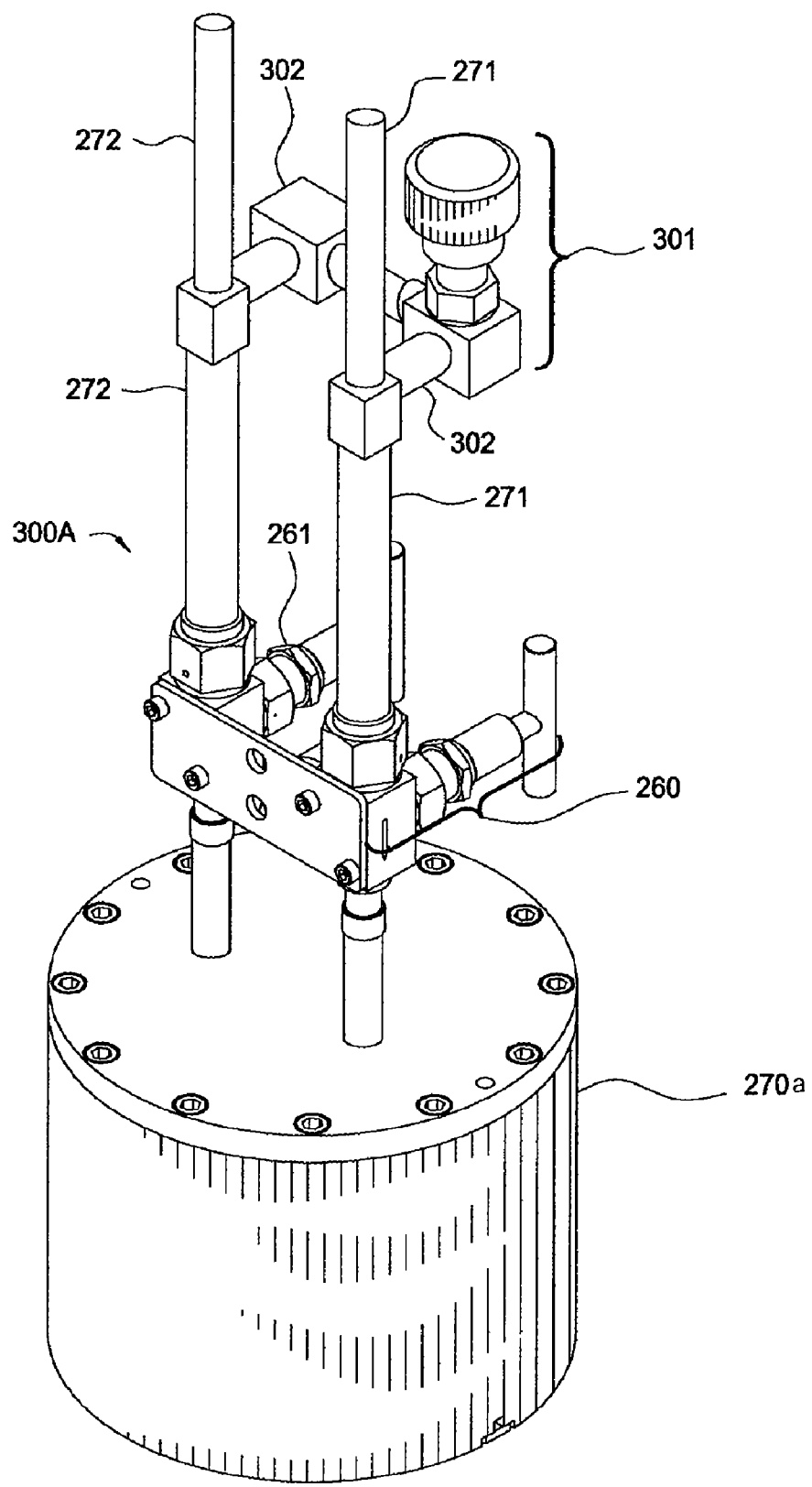
FIG. 4A is a perspective view of the chemical-containing container of FIG. 3A.

FIG. 3A is a schematic diagram of one aspect of the invention, wherein a chemical-containing ampoule or container, ampoule assembly 300A, is configured with a bypass conduit 302 with a remotely controllable valve disposed 301 therein. FIG. 4A is a perspective view of ampoule assembly 300A. Valve 301 may be actuated pneumatically, by an electric motor, or by any other remotely-controllable means. Ampoule assembly 300A, bypass conduit 302, valve 301 and manual valves 260 and 261 are adapted to be a unitary assembly during removal and replacement of ampoule assembly 300A. Ampoule assembly 300A may be fluidly coupled to a gas panel, such as gas panel 204 illustrated in FIG. 2A, via disconnect fittings 262b and 263b. FIG. 2A is a schematic diagram of a fluid delivery system 235A to which ampoule assembly 300A has been fluidly coupled. Except for the substitution of ampoule assembly 300A for ampoule assembly 200, fluid delivery system 235A is substantially identical to fluid delivery system 202 in function and organization as described above in conjunction with FIG. 1.

This aspect allows the effective pump-purge of gas generation line 238 and its constituent parts via the active passage of purge fluid therethrough. Referring to FIG. 2A, during a pump-purge procedure, valves 214, 216 may be closed, forcing all purge fluids through ampoule inlet leg 238a, bypass conduit 302, and ampoule outlet leg 238b. During pump-purge procedures, the only remaining dead legs in fluid delivery circuit 236 are dead leg conduit segments 271b and 272b, which may be as short as from 1 cm to 3 cm and, further, are without any elbows or other impediments to fluid flow. Hence dead leg conduit segments 271b and 272b, which in this aspect are short, straight dead legs, can be more effectively purged before and after replacement of ampoule assembly 300A.

Figure 2B:
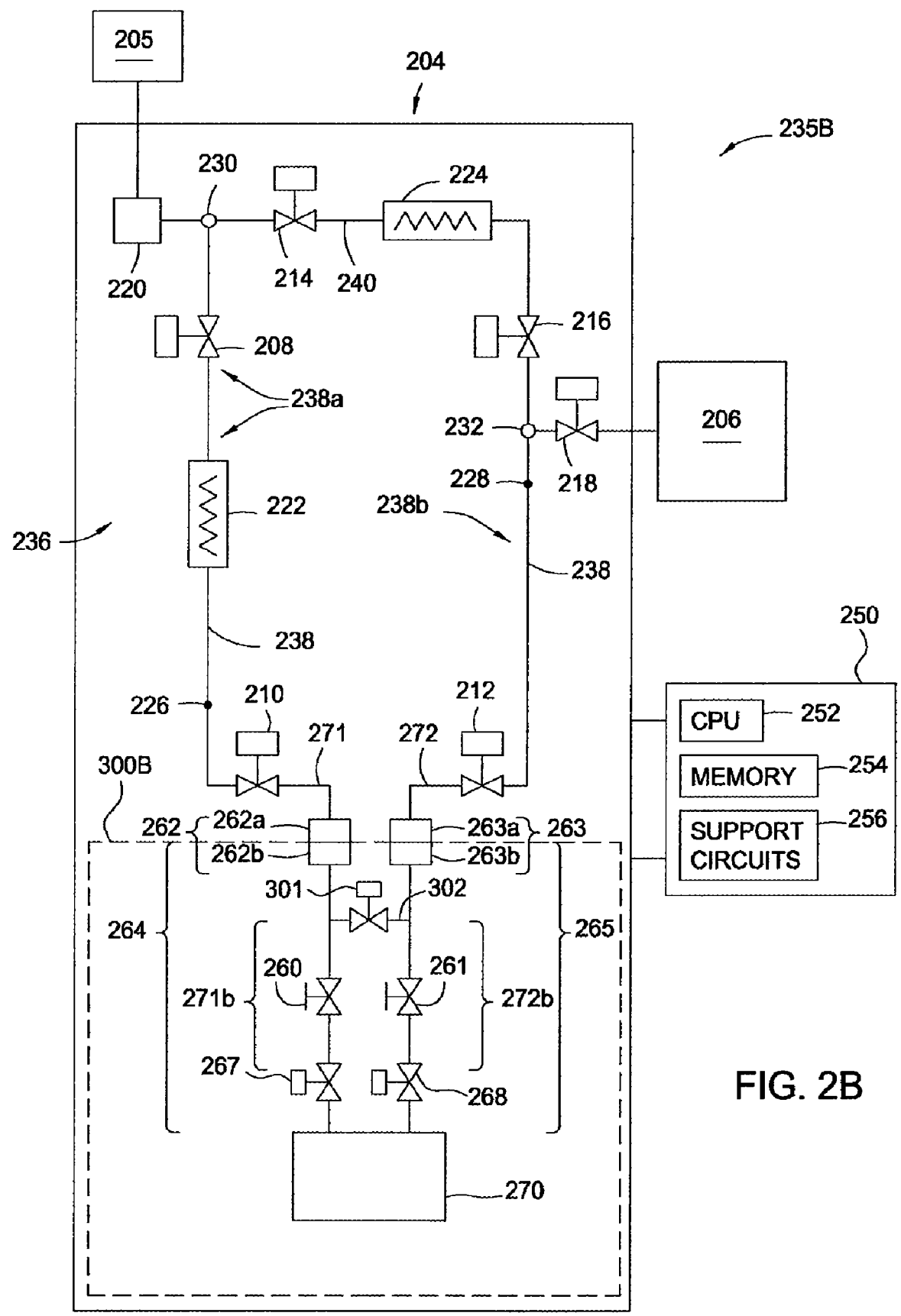
Figure 3B:
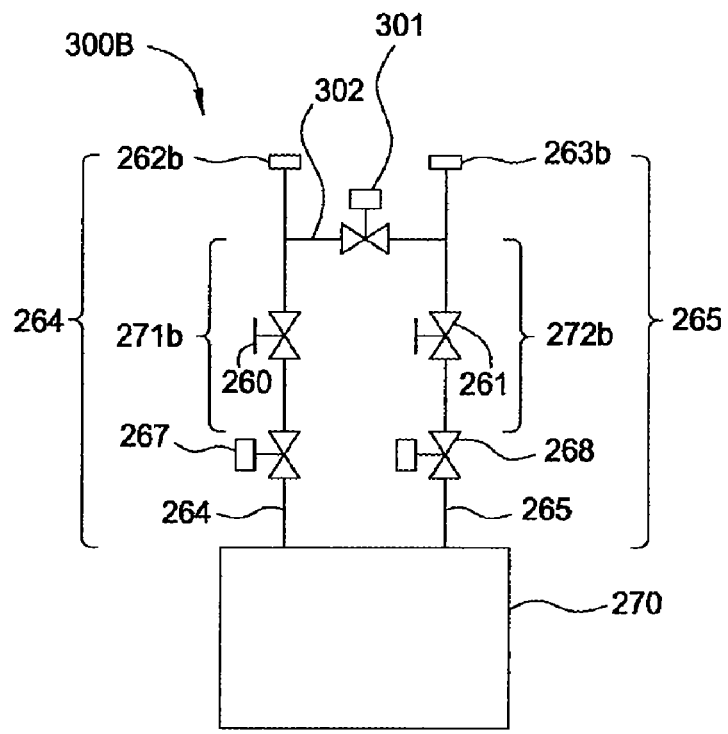
Figure 4B:
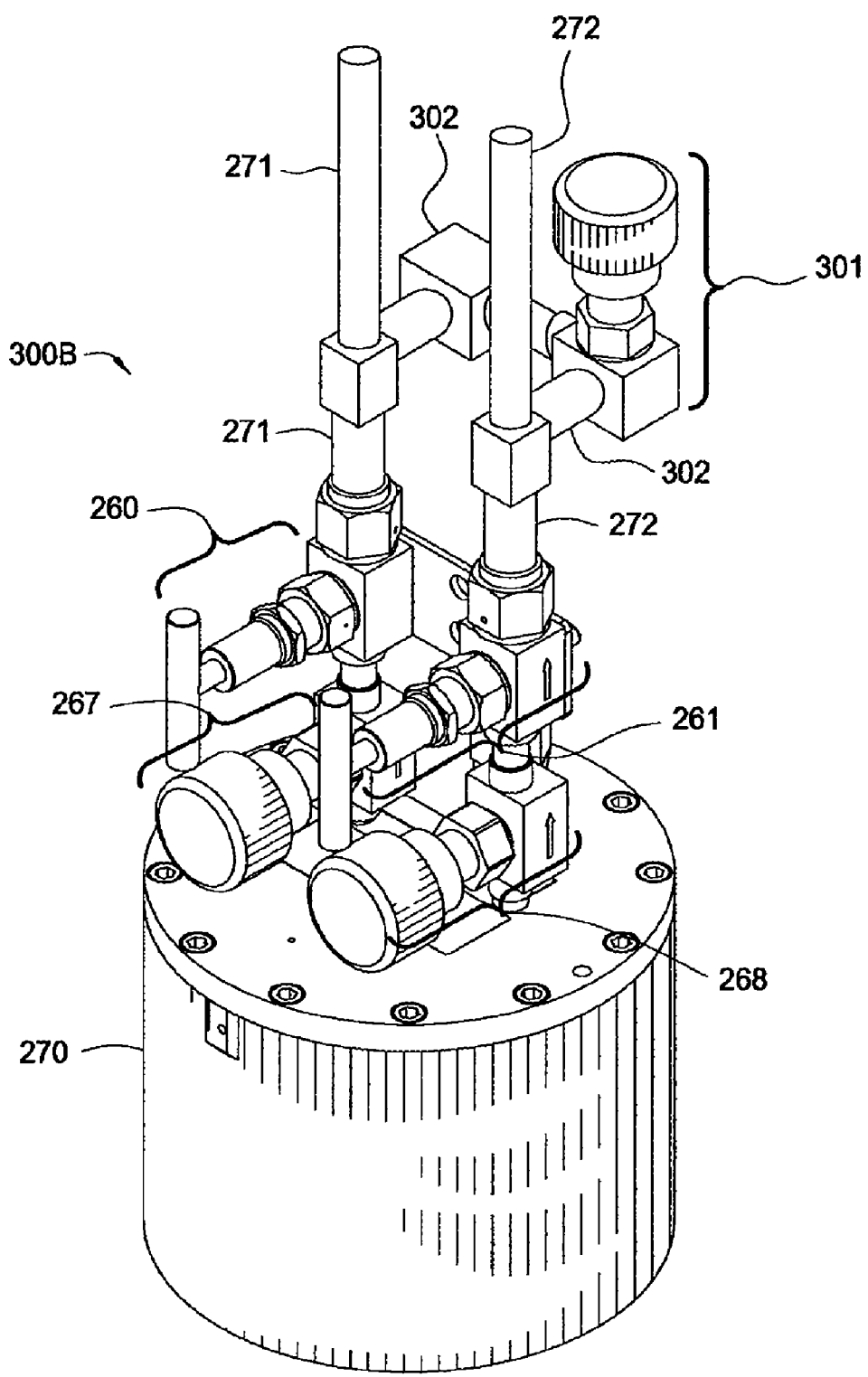
FIG. 4B is a perspective view of the chemical-containing container of FIG. 3B.

FIG. 3B is a schematic diagram of another aspect of the invention, wherein a chemical-containing ampoule or container, ampoule assembly 300B, is configured with two additional remotely controllable shut-off valves, valves 267 and 268 as well as with bypass conduit 302 with remotely controllable valve 301 disposed therein. FIG. 4B is a perspective view of ampoule assembly 300B. Valves 267 and 268 may be actuated by a number of remotely-controllable means as detailed above for valve 301 in conjunction with FIG. 3A. Ampoule assembly 300B, bypass conduit 302, manual valves 260 and 261, and valves 301, 267, and 268 are adapted to be a unitary assembly during removal and replacement of ampoule assembly 300B. Ampoule assembly 300B may be fluidly coupled to gas panel 204 as illustrated in FIG. 2B. FIG. 2B is a schematic diagram of a fluid delivery system 235B to which ampoule assembly 300B has been fluidly coupled. Except for the substitution of ampoule assembly 300 for ampoule assembly 200, fluid delivery system 235B is substantially identical to fluid delivery system 202 in function and organization as described above in conjunction with FIG. 1.

This aspect allows the effective pump-purge of gas generation line 238 and its constituent parts via the active passage of purge fluid therethrough as described above in the previous aspect. In addition, maintenance personnel may perform a pump-purge procedure prior to ampoule replacement without entry into gas panel 204. Valve 301 and valves 267 and 268 may be closed remotely via controller 250, fluidly coupling ampoule inlet leg 238a and ampoule outlet leg 238b to a vacuum source, such as process chamber 206, and a purge fluid source, such as carrier gas source 205. This is an important safety advantage since entry into gas panel 204 and manipulation of manual valves therein is not required until fluid delivery circuit 236 has been safely pump-purged. Ordinarily, maintenance personnel must enter gas panel 204 to close manual valves 260 and 261 prior to initiating pump-purge procedures. Further, ampoule assembly 300B has two points of isolation from ambient contamination for inlet line 264 and outlet line 265, namely manual valve 260, valve 267 and manual valve 261, valve 268, respectively. This redundancy minimizes the risk of leakage into or out of ampoule assembly 300B in the event that manual valves 260 and 261 are not leak-tight. As noted above, there is ordinarily only a single point of isolation for the contents of an ampoule during ampoule removal, leak checking, and pump-purging.

Figure 5:
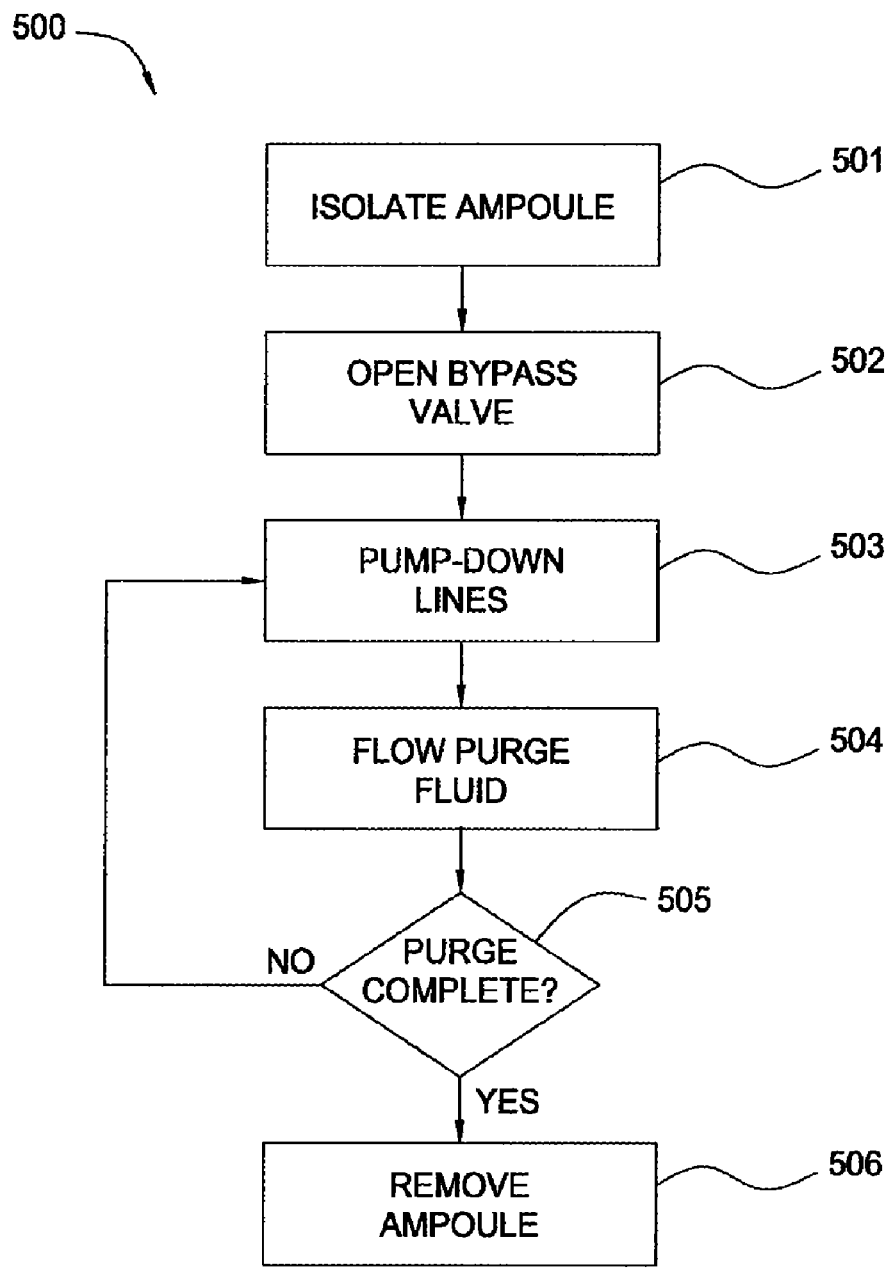
FIG. 5 illustrates a process sequence for pump-purging an ampoule assembly.

FIG. 5 illustrates a process sequence 500 for pump-purging ampoule assembly 300B. In step 501, valves 267 and 268 are closed remotely via controller 250, isolating body 270 from ampoule inlet leg 238a and ampoule outlet leg 238b. In the step 502, bypass valve 301 is opened remotely via controller 250, fluidly coupling ampoule inlet leg 238a, ampoule outlet leg 238b and the majority of inlet line 264 and outlet line 265. The vacuum source may be the vacuum source associated with process chamber 206. In step 503, fluid delivery circuit 236, bypass conduit 302, inlet line 264, and outlet line 265 are pumped down to the desired level of vacuum. In step 504, a purge fluid, such as a carrier gas or in some cases a liquid solvent, is then flowed through the evacuated lines. Heater 222 may heat the purge fluid, if desired. When the purge fluid source is configured relative to fluid delivery circuit 236 as illustrated in FIG. 2B, the purge fluid enters ampoule assembly 300B via ampoule inlet leg 238a, flows through bypass conduit 302, and leaves ampoule assembly 300B via ampoule outlet leg 238b. In addition, the purge fluid back-fills the portions of inlet line 264 and outlet line 265 fluidly coupled to bypass conduit 302. The duration and flow rate of purge fluid flow through ampoule assembly 300B is dependent on the purge fluid used, conduit size, chemical composition of unwanted residues, and quantity thereof present in the lines. In step 505, completion of pump-purge procedure is checked. If the purging of the desired lines is complete, the process continues to step 506, wherein ampoule assembly 300B is removed from gas panel 204. If further pump-purge steps are desired, the process returns to step 503. The number of pump-purge iterations desired is variable, depending on such factors as the purge fluid used, conduit size, chemical composition of unwanted residues, and quantity thereof that may be present in the lines.

Figure 2C:
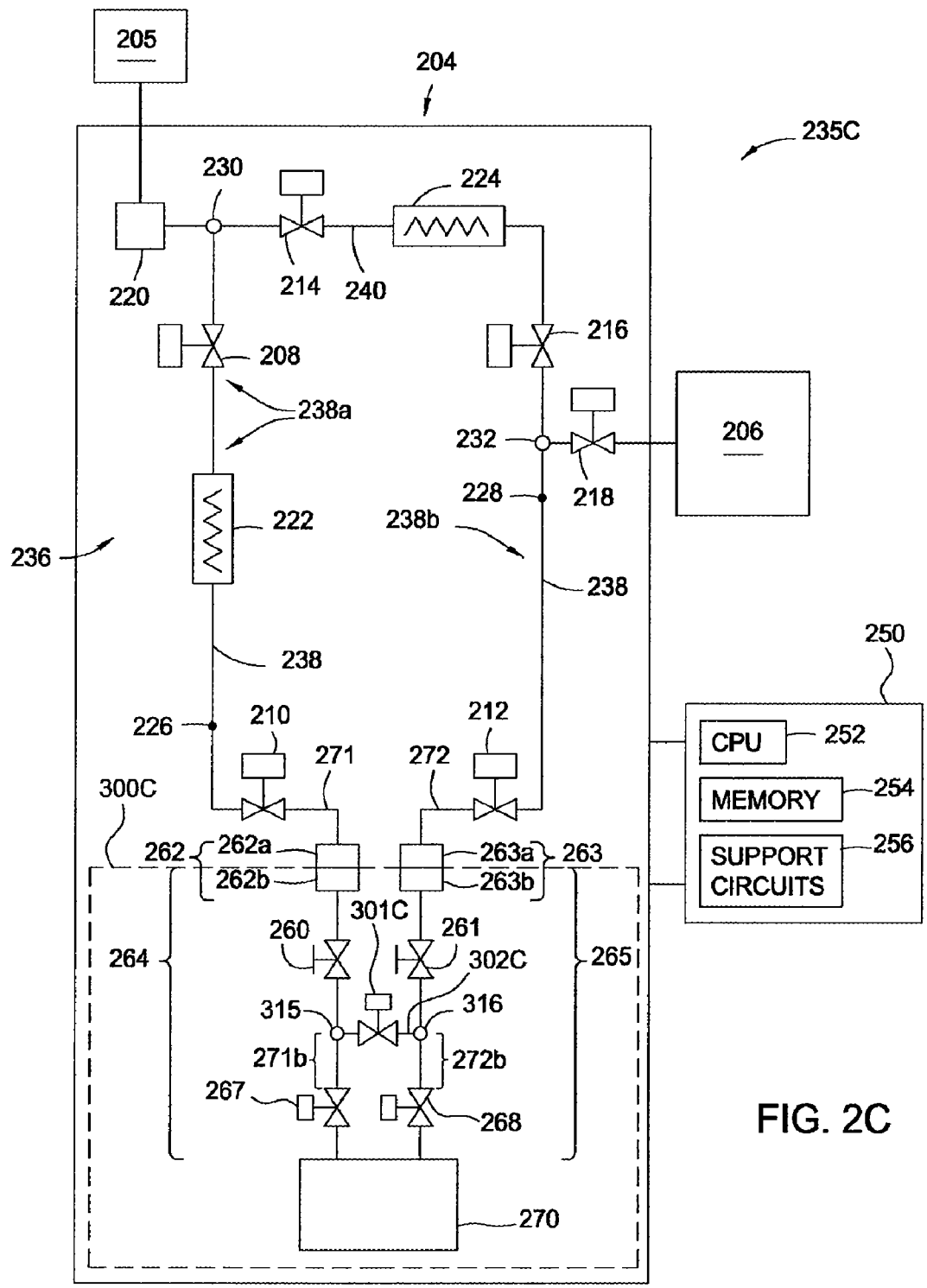
Figure 3C:
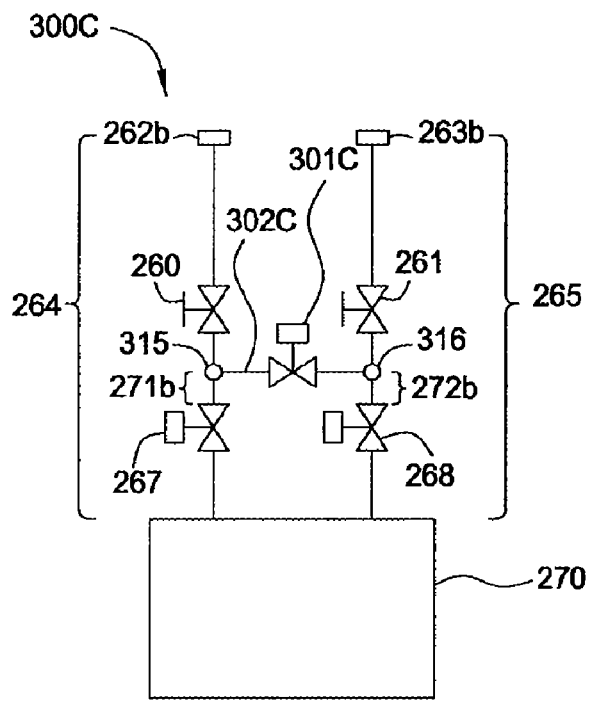

FIG. 3C is a schematic diagram of another aspect of the invention. In this aspect, ampoule assembly 300C is configured with an inherent valve assembly similar to that of ampoule assembly 300B, as illustrated in FIG. 3B. An inherent bypass conduit 302C that has a remotely controllable valve 301C disposed therein fluidly couples dead leg conduit segments 271b and 272b as in the previous two aspects, but in this aspect, the connection points of bypass conduit 302C to dead leg conduit segments 271b and 272b are located at junctions 315, 316, respectively. Junction 315 is disposed between manual valve 260 and valve 267 and junction 316 is disposed between manual valve 261 and valve 268. Ampoule assembly 300C may be fluidly coupled to gas panel 204 as illustrated in FIG. 2C. FIG. 2C is a schematic diagram of a fluid delivery system 235C to which ampoule assembly 300C has been fluidly coupled. Except for the substitution of ampoule assembly 300C for ampoule assembly 200, fluid delivery system 235C is substantially identical to fluid delivery system 202 in function and organization as described above in conjunction with FIG. 1.

This aspect allows the effective pump-purge of gas generation line 238 and its constituent parts as described above for the previous aspects of the invention. In addition, this aspect provides a means of actively passing a purge fluid through manual valves 260 and 261 during a pump-purge procedure. Referring to FIGS. 2C and 3C, valve 301C and valves 267 and 268 may be closed remotely via controller 250, allowing valves 267 and 268 to be more thoroughly purged prior to removal of ampoule assembly 300C. In addition, the size of dead legs present during the pump-purge procedure are reduced to the dead leg conduit segments 271b and 272b, i.e., the conduit segment located between junction 315 and valve 267 and the conduit segment located between junction 316 and valve 268. Hence, the dead leg conduit segments 271b and 272b for this aspect are substantially reduced in length when compared to dead leg conduit segments 271b and 272b for the previous aspect shown in FIG. 3B.

Figure 3D:
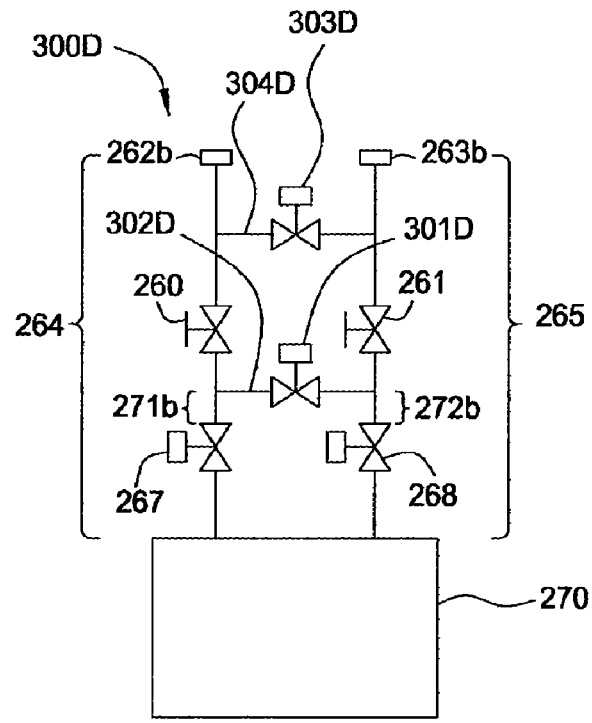

FIG. 3D is a schematic diagram of another aspect of the invention. In this aspect, ampoule assembly 300D is configured with an inherent valve assembly similar to that of ampoule assembly 300C, as illustrated in FIG. 3C. An inherent bypass conduit 302D that has a remotely controllable valve 301D disposed therein fluidly couples dead leg conduit segments 271b and 272b as in the previous two aspects, but in this aspect there is a second bypass conduit 304D configured with a remotely controllable valve 303D disposed therein. Ampoule assembly 300D may be fluidly coupled to gas panel 204 as illustrated for ampoule assemblies 300A-300C in FIGS. 2A-2C.

Figure 3E:
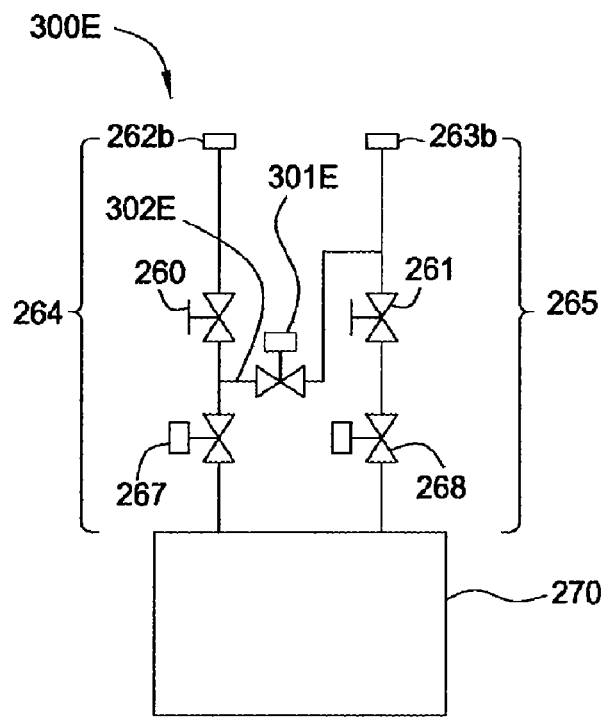
Figure 3F:
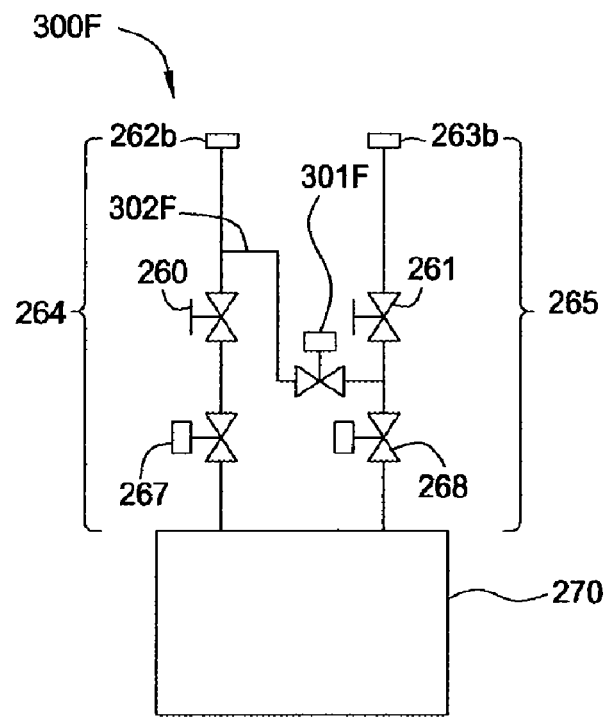
Figures 3G, 3H:
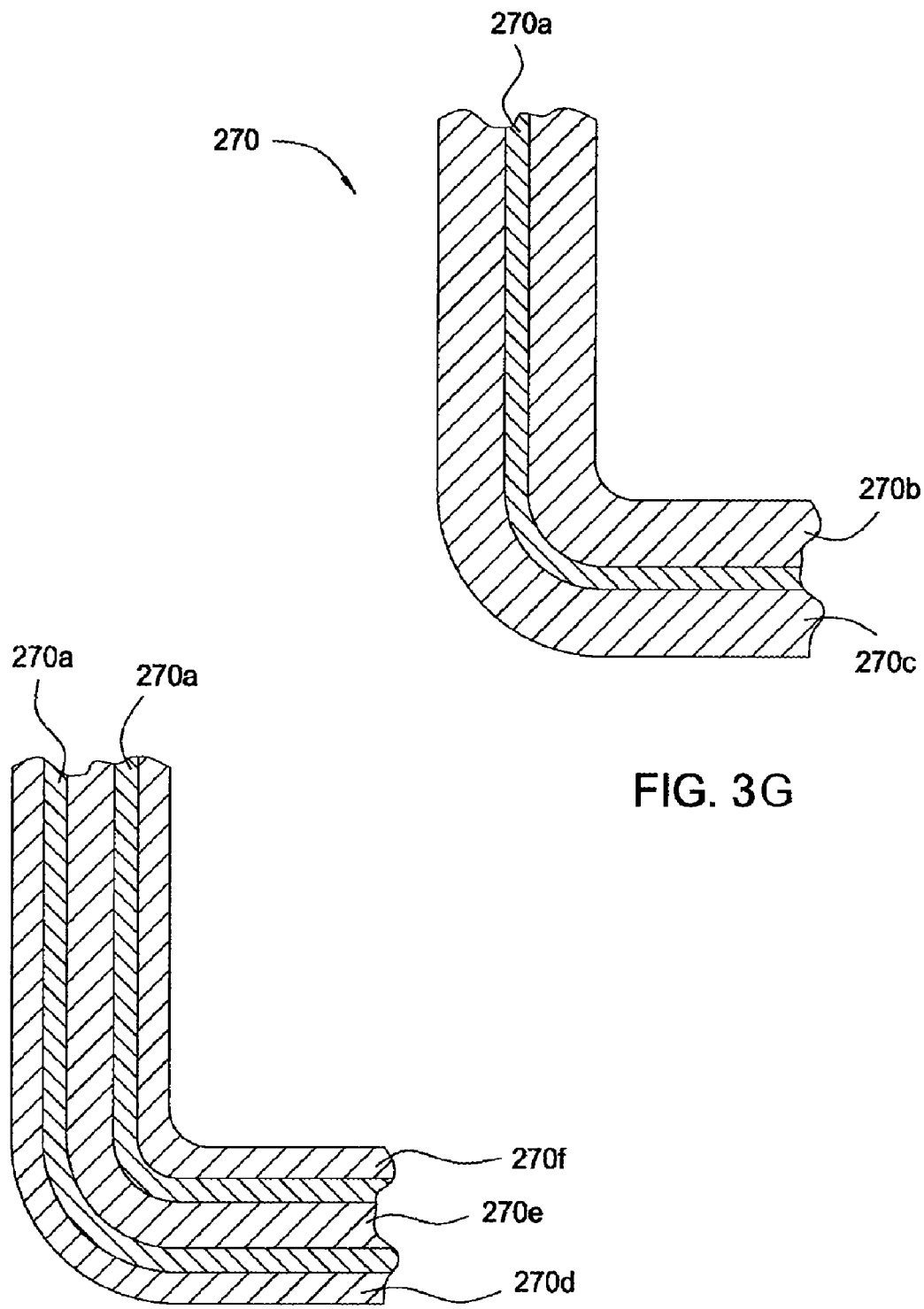

FIGS. 3E-3F illustrate two other aspects of embodiments of the invention. Ampoule assemblies 300E and 300F are each configured with an inherent valve assembly similar to that of ampoule assembly 300C, as illustrated above in FIG. 3C. In the aspect illustrated in FIG. 3E, bypass conduit 302E and remotely controllable valve 301E disposed therein fluidly couple inlet line 264 with outlet line 265. Bypass conduit 302E is connected to inlet line 264 between manual valve 260 and valve 267 and is connected to outlet line 265 between manual valve 261 and disconnect fitting 263b. In the aspect illustrated in FIG. 3F, bypass conduit 302F and remotely controllable valve 301F disposed therein fluidly couple inlet line 264 with outlet line 265. Bypass conduit 302F is connected to inlet line 264 between manual valve 260 and disconnect fitting 262b and is connected to outlet line 265 between manual valve 261 and valve 268.

As noted above, in some aspects of the invention, some or all components of a chemical-containing ampoule are charged with an inert gas, such as He. The advantages of this are twofold. First, charging the ampoule body with a pressurized atmosphere of an inert gas chemically protects the precursor contained therein, even if some leakage occurs through any of the seals or valves in the ampoule assembly. This is particularly true for a solid precursor-containing ampoule assembly. Second, during a leak-checking procedure, such as that described above in conjunction with FIG. 1, a helium charge in the inlet line allows for leak-checking after new ampoule installation of not only of leakage into disconnect fittings 262 and 263 from outside fluid delivery system 202 (see FIG. 1), but also of leakage through the outermost shut-off valve located in inlet line 264 and outlet line 265, such as manual valves 260 and 261. It is important to note that the typical leak rate through shut-off valves, such as manual valves 260 and 261, is much higher than the typical leak rate externally, i.e., through the external seals of said valves, hence, checking for leakage through manual valves 260 and 261 is an important procedure. In instances wherein it is undesirable for the ampoule body to be charged with an inert gas, which may be the case for certain liquid precursors, only a segment of the inlet and outlet lines may be charged with the inert gas. For example, referring to FIG. 2B, the segment of inlet line 264 disposed between manual valve 260 and valve 267, and the segment of outlet line 265 disposed between manual valve 261 and valve 268, may be the only regions of ampoule assembly 300A charged with an inert gas.

A more detailed description of a precursor-containing ampoule that may be contained in some configurations of the invention may be found in commonly assigned U.S. Ser. No. 11/246,890, filed Oct. 7, 2005, and issued as U.S. Pat. No. 7,464,917, which is hereby incorporated by reference in its entirety to the extent not inconsistent with the claimed invention.

As noted above, the sealing surfaces of shut-off valves that are exposed to highly reactive chemical precursors for extended periods, such as manual valves 260 and 261 (shown in FIGS. 2A-2C), may be damaged and fail to seal as desired. This is particularly true when an ampoule assembly contains a solid precursor. Solid precursors dissolved by a heated carrier gas may subsequently precipitate out of the carrier gas if not maintained at the necessary temperature and condense onto shut-off valve sealing surfaces, hindering a vacuum-tight seal and requiring valve replacement. Because valve replacement for ampoule assemblies occurs relatively frequently, ease of serviceability is also an important consideration.

Figure 6B:
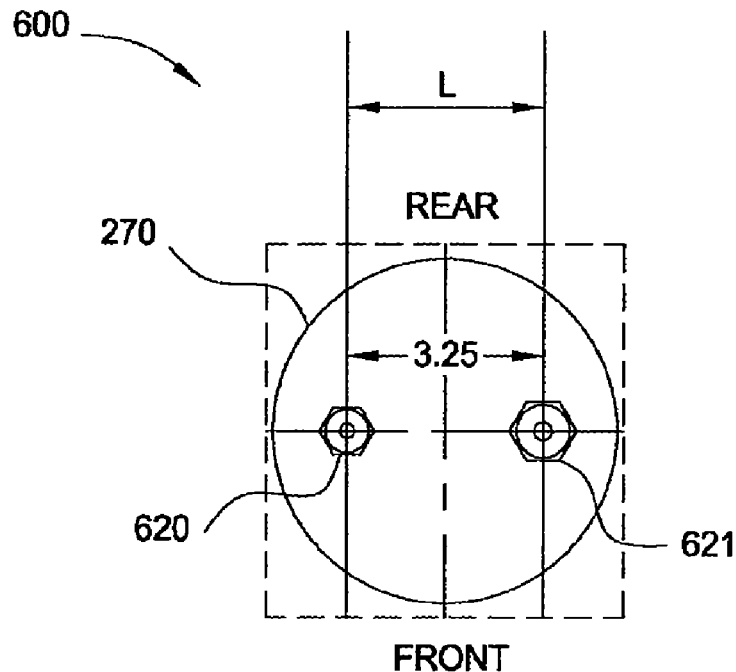
FIGS. 6A-6B schematically illustrate one embodiment of an ampoule assembly with easily serviceable shut-off valves.
Figure 6A:
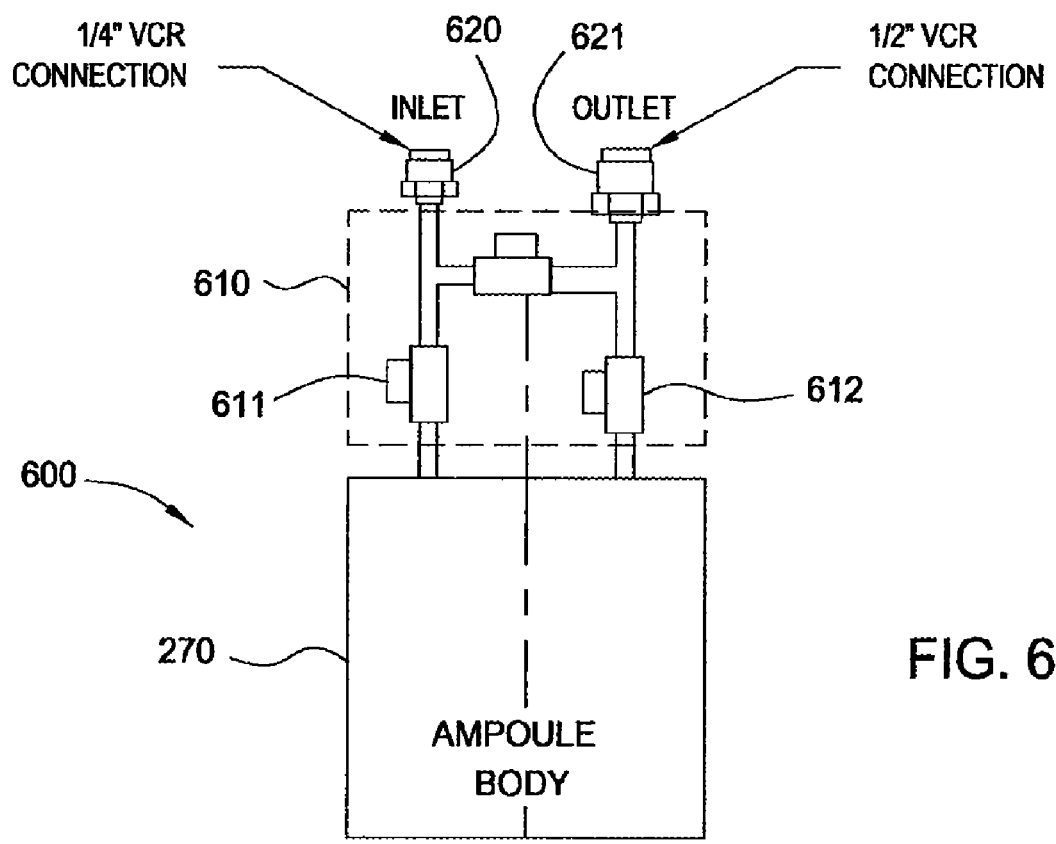

FIGS. 6A and 6B schematically illustrate one embodiment of ampoule assembly 600 with easily serviceable shut-off valves. FIG. 6A is a schematic side view and FIG. 6B is a schematic top view. Ampoule assembly 600 includes valve assembly 610, ampoule body 270, inlet connection 620, and outlet connection 621. Inlet connection 620 is preferably a ¼ inch VCR connection and outlet connection 621 is preferably a ½ inch VCR connection for ease of repeated installation and removal of ampoule assembly 600 from a processing system. Valve assembly 610 includes shut-off valves 611 and 612, which are also configured to be easily removed. Shut-off valves 611 and 612 are preferably mounted to valve assembly 610 via VCR fittings (not shown for clarity) and positioned to have a convenient clearance from other components of valve assembly 610 and ampoule assembly 600. In one example, shut-off valves 611 and 612 are positioned 3.25 inches apart to allow adequate access for removal from and installation in valve assembly 610.

While the foregoing is directed to embodiments of the invention, other and further embodiments of the invention may be devised without departing from the basic scope thereof, and the scope thereof is determined by the claims that follow.

The invention claimed is:

1. An ampoule assembly, comprising:
   at least one layer of a first material disposed on an outside surface of an ampoule body;
   at least one layer of a second material disposed over the first material, wherein the first material is more thermally conductive than the second material;
   an inlet line coupled with and in fluid communication to the ampoule body;
   an outlet line coupled with and in fluid communication to the ampoule body;
   a bypass line connected between the inlet line and the outlet line;
   a bypass valve disposed in the bypass line to fluidly couple or decouple the inlet line and the outlet line via the bypass line;
   a first shut-off valve disposed in the inlet line between the ampoule body and a first connection point of the bypass line and the inlet line;
   a second shut-off valve disposed in the outlet line between the ampoule body and a second connection point of the bypass line and the outlet line;
   a third shut-off valve disposed in the inlet line between the first connection point of the bypass line and a first disconnect fitting disposed on the inlet line; and
   a fourth shut-off valve disposed in the outlet line between the second connection point of the bypass line and a second disconnect fitting disposed on the outlet line.

2. The ampoule assembly of claim 1, wherein the second material is mechanically stronger than the first material.

3. The ampoule assembly of claim 1, wherein the first material comprises a metal selected from the group consisting of aluminum, copper, silver, brass, and combinations thereof.

4. The ampoule assembly of claim 1, wherein the first material is a film having a thickness within a range from about 1 micrometer to about 5 millimeters.

5. The ampoule assembly of claim 1, wherein the bypass valve is a remotely controllable bypass valve.

6. The ampoule assembly of claim 1, wherein the first and second shut-off valves are remotely controllable valves and the third and fourth shut-off valves are manually controllable valves.

7. The ampoule assembly of claim 1, further comprising:
   a second bypass line connected between the inlet line and the outlet line;
   a first connection point of the second bypass line and the inlet line;
   a second connection point of the second bypass line and the outlet line; and
   a second bypass valve disposed in the second bypass line to fluidly couple or decouple the inlet line and the outlet line via the second bypass line.

8. The ampoule assembly of claim 7, wherein:
   the first connection point of the second bypass line is between the third shut-off valve and the first disconnect fitting; and
   the second connection point of the second bypass line is between the fourth shut-off valve and the second disconnect fitting.

9. The ampoule assembly of claim 7, wherein:
   the first connection point of the second bypass line is between the ampoule body and the first disconnect fitting; and
   the second connection point of the second bypass line is between the ampoule body and the second disconnect fitting.

10. The ampoule assembly of claim 7, wherein the second bypass valve is a remotely controllable bypass valve.

11. The ampoule assembly of claim 1, wherein the ampoule body contains a chemical precursor used in vapor deposition processing, and the ampoule body is pressurized above atmospheric pressure with a gas that is chemically inert to the chemical precursor.

12. An ampoule assembly, comprising:
    at least one layer of a first material disposed on an outside surface of an ampoule body;
    at least one layer of a second material disposed over the first material, wherein the first material is more thermally conductive than the second material;
    an inlet line coupled with and in fluid communication to the ampoule body;
    an outlet line coupled with and in fluid communication to the ampoule body;
    a bypass line connected between the inlet line and the outlet line;
    a bypass valve disposed in the bypass line to fluidly couple or decouple the inlet line and the outlet line via the bypass line;
    a first shut-off valve disposed in the inlet line between the ampoule body and a first connection point of the bypass line and the inlet line;
    a second shut-off valve disposed in the outlet line between the ampoule body and a second connection point of the bypass line and the outlet line;
    a third shut-off valve disposed in the inlet line between the ampoule body and a first disconnect fitting disposed on the inlet line; and
    a fourth shut-off valve disposed in the outlet line between the ampoule body and a second disconnect fitting disposed on the outlet line.

13. The ampoule assembly of claim 12, wherein the second material is mechanically stronger than the first material.

14. The ampoule assembly of claim 12, wherein the first material comprises a metal selected from the group consisting of aluminum, copper, silver, brass, and combinations thereof.

15. The ampoule assembly of claim 12, wherein the first material is a film having a thickness within a range from about 1 micrometer to about 5 millimeters.

16. The ampoule assembly of claim 12, wherein the first connection point of the bypass line is disposed between the first shut-off valve and the first disconnect fitting, and the second connection point of the bypass line is disposed between the second shut-off valve and the second disconnect fitting.

17. The ampoule assembly of claim 12, wherein the first connection point of the bypass line is disposed between the first shut-off valve and the third shut-off valve.

18. The ampoule assembly of claim 17, wherein the second connection point of the bypass line is disposed between the second shut-off valve and the fourth shut-off valve.

19. The ampoule assembly of claim 12, wherein the first connection point of the bypass line is disposed between the third shut-off valve and the first disconnect fitting.

20. The ampoule assembly of claim 19, wherein the second connection point of the bypass line is disposed between the second shut-off valve and the fourth shut-off valve.

21. The ampoule assembly of claim 12, wherein the bypass valve is a remotely controllable bypass valve.

22. The ampoule assembly of claim 12, wherein the first and second shut-off valves are remotely controllable valves.

23. The ampoule assembly of claim 22, wherein the third and fourth shut-off valves are manually controllable valves.

24. The ampoule assembly of claim 12, further comprising:
- a second bypass line connected between the inlet line and the outlet line;
- a second bypass valve disposed in the second bypass line to fluidly couple or decouple the inlet line and the outlet line via the second bypass line, wherein:
- the first shut-off valve is disposed between the first connection point of the first bypass line and the inlet line and a first connection point of the second bypass line and the inlet line; and
- the second shut-off valve is disposed between the second connection point of the first bypass line and the outlet line and a second connection point of the second bypass line and the outlet line.

25. The ampoule assembly of claim 12, further comprising:
- a second bypass line connected between the inlet line and the outlet line;
- a second bypass valve disposed in the second bypass line to fluidly couple or decouple the inlet line and the outlet line via the second bypass line, wherein:
- the third shut-off valve is disposed between the first connection point of the first bypass line and the inlet line and a first connection point of the second bypass line and the inlet line; and
- the fourth shut-off valve is disposed between the second connection point of the first bypass line and the outlet line and a second connection point of the second bypass line and the outlet line.

* * * * *